(12) United States Patent
Markulic et al.

(10) Patent No.: US 12,542,562 B2
(45) Date of Patent: Feb. 3, 2026

(54) INPUT BUFFER AND A METHOD FOR REDUCING A SIGNAL AMPLITUDE DEPENDENCY OF SAID INPUT BUFFER

(71) Applicant: IMEC VZW, Leuven (BE)

(72) Inventors: Nereo Markulic, Etterbeek (BE); Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 79 days.

(21) Appl. No.: 18/519,144

(22) Filed: Nov. 27, 2023

(65) Prior Publication Data

US 2024/0178855 A1    May 30, 2024

(30) Foreign Application Priority Data

Nov. 29, 2022 (EP) .................................... 22210186

(51) Int. Cl.
*H03M 1/12* (2006.01)
*H03M 1/06* (2006.01)

(52) U.S. Cl.
CPC ....... *H03M 1/1245* (2013.01); *H03M 1/0614* (2013.01)

(58) Field of Classification Search
CPC .... H03M 1/1245; H03M 1/0614; H03M 1/12; H03F 2200/213; H03F 2200/267;
(Continued)

(56) References Cited

U.S. PATENT DOCUMENTS 3,835,406 A     9/1974   Thompson
11,196,412 B1 * 12/2021  Francis ............... H03K 17/162
(Continued)

FOREIGN PATENT DOCUMENTS

DE           10249186 A1 * 11/2003   ........... H03B 5/1228

OTHER PUBLICATIONS

Wang, Chengzhou, et al.. "A capacitance-compensation technique for improved linearity in CMOS class-AB power amplifiers." IEEE journal of solid-state circuits vol. 39,1 No. 11, Nov. 2004: pp. 1927-1937.

(Continued)

*Primary Examiner* — Lincoln D Donovan
*Assistant Examiner* — Amit R Bhatia
(74) *Attorney, Agent, or Firm* — MOSER TABOADA (57) ABSTRACT

An input buffer for an analog-to-digital converter, ADC, is provided. The input buffer is configured for receiving an input signal ($V_{in}$) and for outputting an output signal ($V_{out}$), and comprises an nMOS transistor and pMOS transistor. The nMOS transistor and the pMOS transistor are arranged in a push-pull configuration such that the input signal is fed to gates of the nMOS transistor and the pMOS transistor and the output signal is taken from sources of the nMOS and the pMOS transistors. The input buffer comprises a first varactor connected between a gate of the nMOS transistor and a first biasing voltage potential ($V_{21}$), and a second varactor connected between a gate of the pMOS transistor and a second biasing voltage potential ($V_{22}$), which are configured to reduce a signal amplitude dependency of a capacitance of the input buffer.

15 Claims, 4 Drawing Sheets

(58) Field of Classification Search
CPC ........... H03F 2200/297; H03F 2200/42; H03F 2203/30081; H03F 2203/30084; H03F 3/195; H03F 3/3028; H03F 1/3217
See application file for complete search history.

(56) References Cited

U.S. PATENT DOCUMENTS

| | | |
|---|---|---|
| 2002/0044012 A1 | 4/2002 | Otsuka et al. |
| 2003/0143964 A1 | 7/2003 | Otsuka et al. |
| 2013/0154744 A1 | 6/2013 | Samavedam et al. |
| 2015/0123714 A1 | 5/2015 | Sun et al. |
| 2018/0076808 A1 | 3/2018 | Singer |

OTHER PUBLICATIONS

Ali, Sheikh Nijam, et al. "A 28GHz 41%-PAE linear CMOS power amplifier using a transformer-based AM-PM distortion-correction technique for 5G phased arrays." 2018 IEEE International Solid-State Circuits Conference—(ISSCC). IEEE, Feb. 17, 2018, pp. 405-407.

Shim, et al. "Symmetric Varactor in 130-nm CMOS for Frequency Multiplier Applications", IEEE Electron Device Letters, IEEE, USA, vol. 32, No. 4, Apr. 2011 (Apr. 1, 2011), pp. 470-472.

Extended European Search Report for EP22210186.7 dated May 25, 2023.

\* cited by examiner

INPUT BUFFER AND A METHOD FOR REDUCING A SIGNAL AMPLITUDE DEPENDENCY OF SAID INPUT BUFFER

CROSS-REFERENCE TO RELATED APPLICATIONS

The present application claims the benefit of and priority to EP Patent Application Serial No. 22210186.7, filed Nov. 29, 2022, the entire contents of which is incorporated herein by reference.

TECHNICAL FIELD

The present disclosure relates to the field of input buffers, and especially input buffers for analog-to-digital converters, ADCs.

BACKGROUND

In the prior art, it is difficult to maintain an analog input signal delivered to an input of an analog-to-digital converter, ADC. The magnitude of this problem is increased in a context of high speed, such as use with input signals having a frequency of a multiple GHz, and/or in high linearity applications. Typically, the input signal is buffered using an input buffer in order to establish a low impedance connection between the input and a sampler of the ADC. An ideal input buffer ideally would transfer an analog input signal to the sampling capacitor(s) linearly, as in without distortion, and/or without being affected by the input frequency. Further, an ideal input buffer would have a low output impedance, in order to compensate for the typical complications present in a realistic sampling environment (such as, for example, charge injection, clock feedthrough, modulated sampling impedance). Further, it is of interest that the input signal buffer has a sufficient performance across variations in process, temperature, and voltage.

SUMMARY

An objective of the present disclosure is to provide an improved input buffer having a decreased signal amplitude dependency of a capacitance of said input buffer, and a method for controlling said improved input buffer. The signal amplitude dependency of the capacitance of the input buffer is one of the factors which causes frequency dependent distortion, and it is therefore of interest of the present disclosure to reduce frequency dependent distortion for input buffers.

According to a first aspect of the present disclosure there is provided an input buffer for an analog-to-digital converter, ADC. The input buffer is configured for receiving an input signal and for outputting an output signal. The input buffer comprises at least one n-channel metal-oxide-semiconductor, nMOS, transistor and at least one p-channel MOS, pMOS, transistor. The at least one nMOS transistor and the at least one pMOS transistor are arranged in a push-pull configuration such that the input signal is fed to gates of the at least one nMOS transistor and the at least one pMOS transistor and the output signal is taken from sources of the at least one nMOS and the at least one pMOS transistors. The input buffer further comprises a first varactor connected between a gate of the at least one nMOS transistor and a first biasing voltage potential, and a second varactor connected between a gate of the at least one pMOS transistor and a second biasing voltage potential. The first varactor and the second varactor are configured to reduce a signal amplitude dependency of a capacitance of the input buffer.

According to an embodiment, the at least one nMOS transistor is one nMOS transistor and the at least one pMOS transistor is one pMOS transistor.

This implies in other words that there is provided an input buffer for an analog-to-digital converter, ADC. The input buffer is configured for receiving an input signal and for outputting an output signal. The input buffer comprises an n-channel metal-oxide-semiconductor, nMOS, transistor and a p-channel MOS, pMOS, transistor. The nMOS transistor and the pMOS transistor are arranged in a push-pull configuration such that the input signal is fed to gates of the nMOS transistor and the pMOS transistor and the output signal is taken from sources of the nMOS and the pMOS transistors. The input buffer further comprises a first varactor connected between a gate of the nMOS transistor and a first biasing voltage potential, and a second varactor connected between a gate of the pMOS transistor and a second biasing voltage potential. The first varactor and the second varactor are configured to reduce a signal amplitude dependency of a capacitance of the input buffer.

Hereinafter, the embodiment including one nMOS transistor and one pMOS transistor in the push-pull configuration is mainly described and reference is made merely to the nMOS transistor and the pMOS transistor, respectively. However, it should be realized that in another embodiment, discussed below the at least one nMOS transistor and the at least one pMOS transistor may comprise more than one nMOS transistor and more than one pMOS transistor (in a cascoded arrangement) and that, in such case, the first varactor may be connected to a gate of any of the nMOS transistors and the second varactor may be connected to a gate of any of the pMOS transistors.

According to a second aspect of the present disclosure there is provided a method. The method comprises the steps of feeding an input signal to gates of an nMOS transistor and a pMOS transistor of the input buffer, biasing a first varactor which is connected to a gate of the nMOS transistor, and biasing a second varactor which is connected to a gate of the pMOS transistor. The first varactor and the second varactor are configured to reduce the signal amplitude dependency of a capacitance of the input buffer.

A common input buffer for a GHz-range input signal may be a push-pull source follower input buffer, or, put differently, an input buffer having a push-pull source follower topology. The input buffer according to the present disclosure may be configured as, or may be understood as, a push-pull source follower input buffer.

The present disclosure is based on an understanding that there exists distortion mechanisms for input buffers, and especially for push-pull source follower input buffers. This present disclosure is mainly focused on one such distortion mechanism. An input impedance of an input buffer according to the present disclosure is capacitive, and is mainly defined by channel capacitances of the input buffer, specifically capacitances of gate-drain channels and gate-source channels of the input buffer. In light of this understanding, it has been discovered that the capacitance of the input buffer is dependent on an amplitude of the input signal to the input buffer. More specifically, it has been discovered that the (small signal) input referred capacitance of the input buffer increases as an absolute value of the input signal increases. A voltage-to-capacitance curve (i.e. the curve in a plot having the amplitude of the input signal along the horizontal axis and the voltage of the input signal along the vertical axis) may be non-constant and may also be non-linear. For instance, the voltage-to-capacitance curve may be understood as having a U-shape, with a minimum capacitance centered around zero voltage. Also, the capacitance of the input buffer being dependent on the amplitude of the input signal is pronounced at large signal swings of the input signal.

In light of the above-mentioned discoveries, the present disclosure provides a reduction of signal amplitude dependency of a capacitance of an input buffer, specifically of an input capacitance of the input buffer, by implementing varactors having a capacitive profile which is inverse to a capacitive profile of the input buffer, thereby reducing signal amplitude dependency of the resulting input buffer. The reduction of the signal amplitude dependency may, alternatively, be understood as, for example, a cancellation of the signal amplitude dependency. The term "capacitive profile" of a component of an input buffer may be understood as the relationship between the amplitude of an input signal and the capacitive contribution made by that component when subjected to said input signal.

A total voltage-to-capacitance curve of the varactors may have a capacitive profile which is inverse in comparison to a voltage-to-capacitance curve of the input buffer (prior to implementing said varactors). A shape of voltage-to-capacitance curve of the varactors may be mirrored, or flipped, along the horizontal axis, in comparison to the voltage-to-capacitance curve of the input buffer.

As a consequence, a total capacitance of the input buffer, comprising the varactors, may be higher than the capacitance of the input buffer without the varactors. However, as the total capacitance of the input buffer comprising the varactors is signal amplitude independent, or having a reduced signal amplitude dependency, the distortion of the input buffer may be reduced.

The biasing of the varactors, using the biasing voltage potentials, may allow for tuning the capacitance of the varactors. The tuning of the varactor capacitances may allow for the capacitance of the input buffer to become signal amplitude independent. The biasing may be performed such that the above discussed relationship between the capacitance of the varactors and the capacitance of the input buffer is achieved.

At least one of the first biasing voltage potential and the second biasing voltage potential may be a tuned biasing voltage potential. In other words, the first biasing voltage potential and/or the second biasing voltage potential may be a tuned biasing voltage potential. The term "tuned biasing voltage potential" may be understood as, for example, a biasing voltage potential which is set to a determined level. The determined level may be calculated such that signal amplitude dependency of the input buffer is minimized. The tuning may be dependent on a plurality of factors, such as, for example, the process, voltage, or temperature characteristics of the input buffer. Thus, the present disclosure allows for tuning of biasing voltage potentials based on different input buffer characteristics.

The step of biasing the first varactor may be performed using a first biasing voltage potential, and the step of biasing the second varactor is performed using a second biasing voltage potential. Thereby, a reduced signal amplitude dependency may be achieved.

The first varactor may be configured as an nMOS-based varactor and the second varactor may be configured as a pMOS-based varactor, or, phrased differently, the first varactor may be an nMOS-based varactor and the second varactor may be a pMOS-based varactor. Thus, the nMOS-based varactor would be connected to the nMOS transistor of the input buffer, and the pMOS-based varactor would be connected to the pMOS transistor of the input buffer. Thus, the input buffer would comprise a pair comprising an nMOS transistor and an nMOS-based varactor, and a pair comprising an pMOS transistor and a pMOS-based varactor.

As used herein, the term nMOS-based varactor means an nMOS transistor, such as an nMOS transistor configured to create an n-type channel in a p-type transistor body, which is configured with shorted drain and source to operate as a varactor. Similarly, the term pMOS-based varactor means a pMOS transistor, such as a pMOS transistor configured to create a p-type channel in an n-type transistor body, which is configured with shorted drain and source to operate as a varactor.

According to a first alternative, gates of the first varactor and second varactors may be connected to the gates of the nMOS transistor and the pMOS transistor, respectively. Phrased differently, the gate of the first varactor may be connected to the gate of the nMOS transistor and the gate of second varactor may be connected to the gate of the pMOS transistor. The first alternative may further involve drains and sources of the first varactor and the second varactor may be connected to the first biasing voltage potential and the second biasing voltage potential, respectively. Phrased differently, the drain and the source of the first varactor may be connected to the first biasing voltage potential, and the drain and the source of the second varactor may be connected to the second biasing voltage potential.

According to a second alternative, drains and sources of the first varactor and the second varactor may be connected to the nMOS transistor and the pMOS transistor, respectively. Phrased differently, the drain and the source of the first varactor may be connected to the nMOS transistor, and the drain and the source of the second varactor may be connected to the pMOS transistor. Further, the second alternative may involve gates of the first varactor and second varactor may be connected to the first biasing voltage potential and the second biasing voltage potential, respectively. Phrased differently, the gate of the first varactor may be connected to the first biasing voltage potential and the gate of the second varactor may be connected to the second biasing voltage potential. The second alternative may be understood as the arrangement of varactors being flipped, with respect to the biasing voltage potentials and the gates of the transistors. The second alternative may involve adjustments of levels of the biasing voltage potentials, when compared to the first alternative, such that the signal amplitude dependency of the capacitance of the input buffer is reduced.

The gate of the nMOS transistor may be connected to a first transistor biasing voltage potential and the pMOS transistor may be connected to a second transistor biasing voltage potential. Drains of the nMOS and the pMOS transistors may be connected to a positive supply voltage and a negative supply voltage, respectively. Phrased differently, the drain of the nMOS transistor may be connected to the positive supply voltage and the drain of the pMOS transistor may be connected to the negative supply voltage. Sources of the nMOS and the pMOS transistors may be connected. The output signal of the input buffer may be taken from the sources of the nMOS and the pMOS transistors. Therefore, the connected sources may, alternatively, be understood as an output (port or terminal) of the input buffer.

The input buffer may further comprise a first capacitor connected between the input signal and the nMOS transistor, and a second capacitor connected between the input signal and the pMOS transistor. The capacitors may be configured to provide direct current isolation, or phrased differently, alternate current shorting. The first and second capacitors may have capacitance which is, at least, an order of magnitude (i.e. at least ten times) higher than the transistors of the input buffer.

A first sum of capacitances of the nMOS transistor, the pMOS transistor, the first varactor and the second varactor may have a lower signal amplitude dependency than a second sum of capacitances of the nMOS transistor and the pMOS transistor. The biasing of the first varactor and the biasing of the second varactor may cause the first sum to have a lower signal amplitude dependency than the second sum. In other words, the addition of the biased varactors to the input buffer may decrease signal dependency of the total capacitance of the input buffer. However, the total capacitance of the input buffer may be increased by the addition of the varactors, since the capacitance of the varactors is added.

According to an embodiment, the at least one nMOS transistor and the at at least one pMOS transistor comprise a first nMOS transistor and a first pMOS transistor connected with the output signal being taken from sources of the first nMOS transistor and the first pMOS transistor. The at least one nMOS transistor and the at least one pMOS transistor may further comprise a cascoded nMOS transistor and a cascoded pMOS transistor. Sources of the cascoded nMOS transistor and the cascoded pMOS transistor may be connected to drains of the nMOS transistor and the pMOS transistor, respectively. Phrased differently, the source of the cascoded nMOS transistor may be connected to the drain of the nMOS transistor and the source of the cascoded pMOS transistor may be connected to the drain of the pMOS transistor.

The first varactor may be connected to a gate of the cascoded nMOS transistor and the second varactor may be connected to a gate of the cascoded pMOS transistor. Thus, the first varactor may be connected between the gate of the cascoded nMOS transistor and the first biasing voltage potential and the second varactor may be connected between the gate of the cascoded pMOS transistor and the second biasing voltage potential. The first and second varactors may be configured to reduce a signal amplitude dependency of the capacitance of the input buffer.

Alternatively, the first varactor may be connected to a gate of the first NMOS transistor and the second varactor may be connected to a gate of the first pMOS transistor.

According to yet another alternative, the input buffer may further comprise a third varactor, and a fourth varactor, wherein the first varactor may be connected to a gate of the cascoded nMOS transistor and the second varactor may be connected to a gate of the cascoded pMOS transistor, the third varactor may be connected between a gate of the first nMOS transistor and a third biasing voltage potential, and the fourth varactor may be connected between a gate of the first pMOS transistor and a fourth biasing voltage potential. The cascoded transistors may be understood as being a first pair of cascoded transistors, wherein the cascoded nMOS transistor is connected to the drain of the nMOS transistor of the input buffer and the cascoded pMOS transistor is connected to the drain of the pMOS transistor of the input buffer. Further, it is to be understood that present disclosure is not limited to including one pair of cascoded transistors, and may comprise a plurality of pairs of cascoded transistors. For example, the present disclosure may involve a second pair of cascoded transistors which are connected to a first pair of cascoded transistors in a similar manner to how the first pair of the cascoded transistors is connected to the transistors of the input buffer. In a corresponding fashion, the present disclosure may involve a third pair of cascoded transistors connected to the second pair of cascoded transistors.

The input buffer may be comprised by an ADC converter, which may further comprise an input terminal connected to the input buffer, and at least one sampling capacitor connected to the input buffer. The input terminal may be connected to gates of the transistors of the input buffer. Further, the input terminal may be connected to gates of the transistors of the input buffer via capacitors configured for providing DC isolation of the input signal, wherein the capacitors may be understood as being comprised by either the ADC or the input buffer.

The present disclosure relates to all possible combinations of features recited in the claims. Objects and features described according to the first aspect may be combinable with, or replaced by, objects and features described according to the second aspect, the third aspect, and/or the fourth aspect, and vice versa.

Further objects and advantages of the various embodiments of the present disclosure will be described below by means of exemplifying embodiments.

BRIEF DESCRIPTION OF THE DRAWINGS

The above, as well as additional objects, features and advantages of the present disclosure, will be better understood through the following illustrative and non-limiting detailed description, with reference to the appended drawings. In the drawings like reference numerals will be used for like elements unless stated otherwise.

Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

Figure 1:
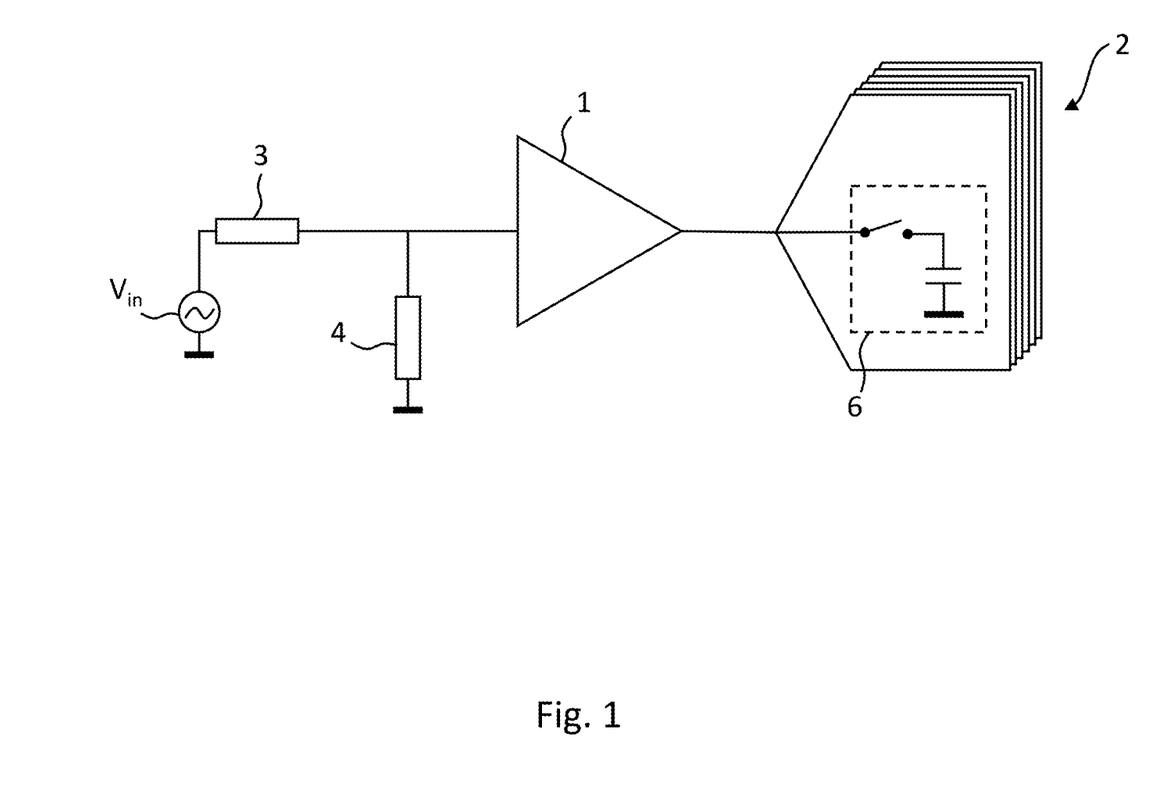
FIG. 1 is a schematic view of an ADC according to an exemplary embodiment.

FIG. 1 illustrates an analog-to-digital converter, ADC, 2 according to an exemplary embodiment. Further, FIG. 1 shows an input buffer 1 having an input and an output. The output of the input buffer 1 is connected to a sampler 6 of the ADC 2. The sampler 6 of the ADC 2 is shown as, but is not limited to being configured as, an interleaved sampler 6 comprising a plurality of interleaving samplers 6 each comprising a sampling capacitance.

FIG. 1 further shows an input signal $V_{in}$ being connected to an input of the input buffer 1 via a source output impedance 3. In FIG. 1 the input signal $V_{in}$ is being illustrated as a voltage source. Further, a termination impedance 4 may be connected between the input of the input buffer 1 and ground (i.e. a zero potential).

Figure 2:
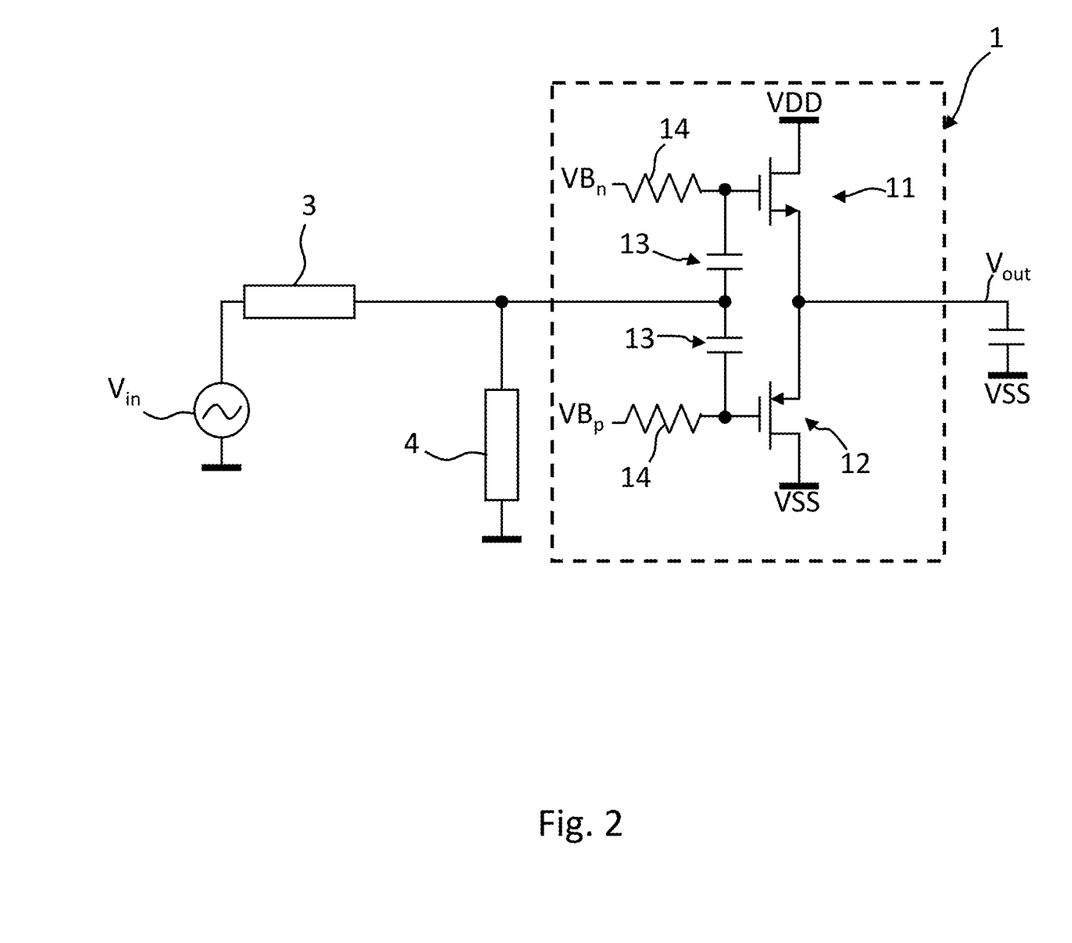
FIG. 2 is a schematic view of an input buffer according to an exemplary embodiment.

FIG. 2 discloses an input buffer 1 according to an exemplifying embodiment. The input buffer 1 has an input and output. The input buffer 1 shown in FIG. 2 is receiving an input signal $V_{in}$ in a similar manner as the input buffer 1 shown in FIG. 1, i.e. via a source output impedance 3, and having a termination impedance 4 which may be connected between the input of the input buffer 1 and ground. However, it is to be understood that the present disclosure is not limited to the shown arrangement, and that the input buffer 1 according to an aspect of the present disclosure may receive an input signal in a different manner than what is shown in FIG. 1 or FIG. 2.

The input buffer 1 comprises an n-channel metal-oxide-semiconductor, nMOS, transistor 11 and a p-channel MOS, pMOS, transistor, 12. The nMOS transistor 11 and the pMOS transistor 12 are arranged in a push-pull configuration such that the input signal is fed to gates of the nMOS transistor 11 and the pMOS 12 transistor and the output signal $V_{out}$ is taken from sources of the nMOS and the pMOS transistors 11, 12, respectively.

The nMOS transistor 11 and the pMOS transistor 12 of the input buffer 1 being arranged in a push-pull configuration may alternatively be understood as the input buffer 1 being configured, or arranged, in accordance with a push-pull source follower topology, and/or the transistors 11, 12 of the input buffer 1 forming a push-pull source follower.

The nMOS transistor 11 and the pMOS transistor 12 being arranged in a push-pull configuration is illustrated in FIG. 2 as the input signal $V_{in}$ being input, or fed, to sources of the transistors 11, 12, and the output signal $V_{out}$ being taken from the sources of the transistors 11, 12. The sources of the transistors 11, 12 may be connected to a negative supply voltage VSS, wherein said connection may be via a capacitor, as shown in the exemplary embodiment of FIG. 2. Further, the drain of the nMOS transistor 11 may be connected to a positive supply voltage VDD and the drain of the pMOS transistor 12 may be connected to the negative supply voltage VSS.

The input signal $V_{in}$ may be fed to the gates via respective capacitors 13 (a first capacitor and a second capacitor). The first and second capacitors 13 may be understood as being configured to provide high-pass filtering of the input signal $V_{in}$, and may alternatively be understood as DC isolating first and second capacitors 13.

The gate of the nMOS transistor 11 may be connected to a first transistor biasing voltage potential $VB_n$ and the pMOS transistor 12 may be connected to a second transistor biasing voltage potential $VB_p$. Further, the transistors 11, 12 may be connected to their respective biasing voltage potentials $VB_n$, $VB_p$ via a respective biasing resistor 14. The biasing voltage potentials $VB_n$, $VB_p$ may be set to levels such that the operating point of the transistors and their current consumption is properly set, and the saturation of the transistors is guaranteed.

Figure 3:
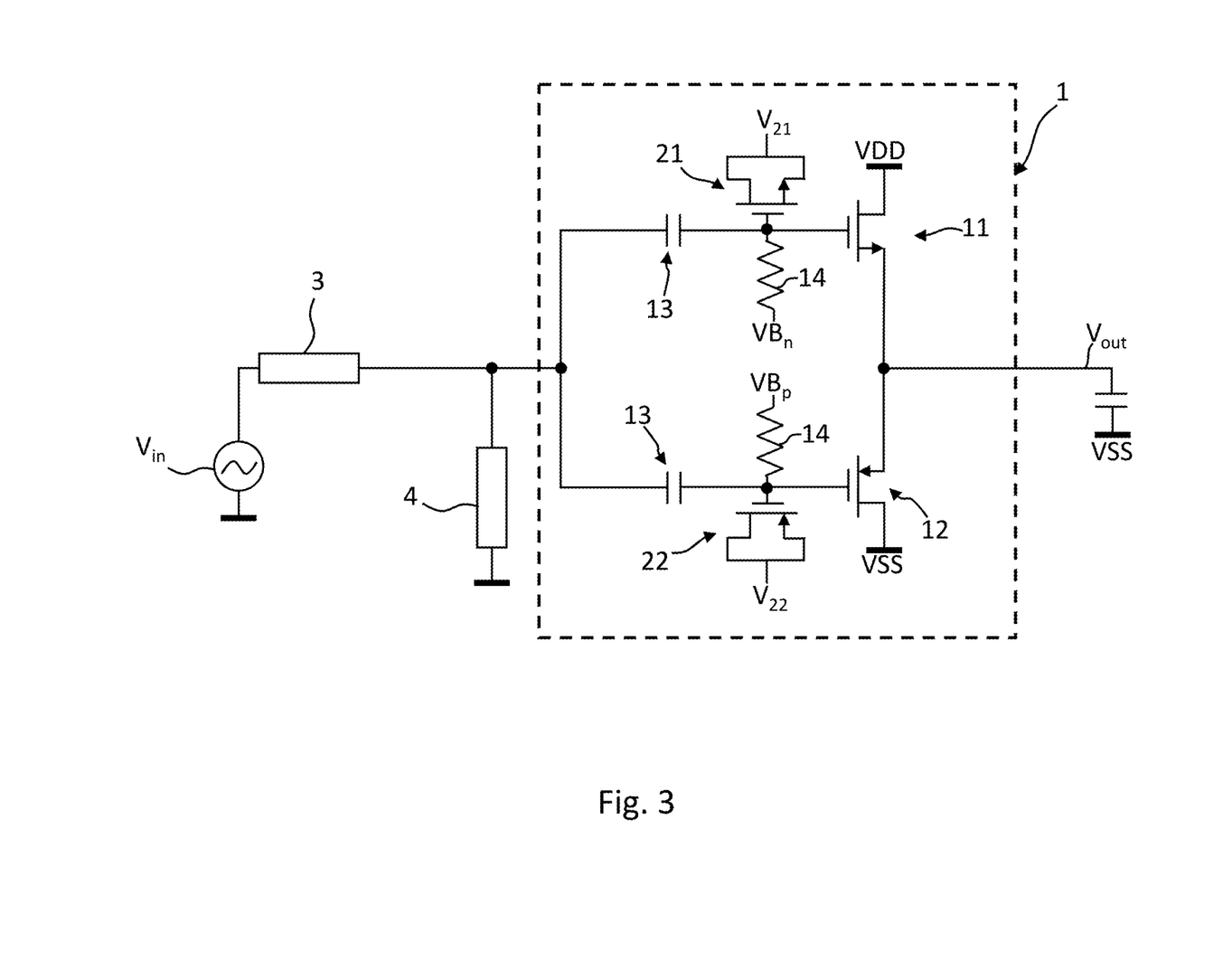
FIG. 3 is a schematic view of an input buffer according to an exemplary embodiment according to an aspect of the present disclosure.

FIG. 3 is a schematic view of an input buffer 1 according to an exemplary embodiment according to an aspect of the present disclosure.

The input buffer 1 shown in FIG. 3 and the input buffer 1 shown in FIG. 2 and described in the related description are similar in that they share a majority of features. Hence, reference is also made to FIG. 2 and the related description for an increased understanding of the input buffer 1 shown in FIG. 3 and discussed in the following.

A difference between the input buffer 1 shown in FIG. 3 and the input buffer 1 shown in FIG. 2 is that the input buffer 1 shown in FIG. 3 further comprises a first varactor 21 and a second varactor 22. The first varactor 21 is connected between the gate of the nMOS transistor 11 and a first biasing voltage potential $V_{21}$. In a corresponding manner, the second varactor 22 is connected between the gate of the pMOS transistor 12 and a second biasing voltage potential $V_{22}$. The purpose of the varactors 21, 22 is to reduce a signal amplitude dependency of a capacitance of the input buffer 1. The capacitance of the input buffer 1 may be understood as a capacitance measured between from the input signal $V_{in}$ to ground.

The biasing voltage potentials $V_{21}$, $V_{22}$ may be set at a level such that a (total) capacitance of the input buffer 1, as seen from the input signal $V_{in}$ to the output signal $V_{out}$, or put differently, between an input of the input buffer 1 and an output of input buffer 1, is not signal amplitude dependent. The biasing voltage potentials $V_{21}$, $V_{22}$ may be understood as being tuned, or set to a voltage, such that the resulting total capacitance of the input buffer 1 is not signal amplitude dependent, or at least, has a reduced signal amplitude dependency. The resulting total capacitance may be higher, as the capacitance of the varactors 21, 22 is added. However, the removal, or reduction, of the signal amplitude dependency of capacitance the input buffer 1 provides reduced distortion for the input buffer 1.

The input buffer 1 according to the present disclosure may be understood as each transistor 11, 12 having a respective varactor 21, 22 connected thereto, wherein the varactor 21 is configured for cancelling or reducing the signal amplitude dependency of the capacitance caused by the transistor 12 and the varactor 22 is configured for cancelling or reducing the signal amplitude dependency of the capacitance caused by the transistor 11. Further, the supply voltages VDD, VSS and the biasing voltage potentials $V_{21}$, $V_{22}$ may be understood as being tuned, or adjusted, with regards to each other, such that the signal amplitude dependency of the capacitance of the input buffer 1 is partially, or completely, cancelled, or reduced.

The first varactor 21 is shown as being configured as an nMOS-based varactor, and the second varactor 22 is shown as being configured as a pMOS based varactor, which may be understood as preferred embodiment.

The gates of first and second varactors 21, 22 are connected to the gate of their respective transistor 11, 12. Further, the source and drain of each of the first varactor 21 and the second varactor 22 are connected to the first biasing voltage potential $V_{21}$ and the second biasing voltage potential $V_{22}$, respectively. The biasing voltage potentials may operate in nominal supply range between the positive supply voltage VDD and the negative supply voltage VSS, such that biasing may be easily provided.

However, the present disclosure is not limited to the first varactor 21 being configured as a pMOS-based varactor, and the second varactor 22 is being configured as a nMOS based varactor. The first varactor 21 may, for example, be configured as nMOS-based varactor, and/or the second varactor 22 may, for example, be configured as a pMOS-based varactor. However, in order to achieve a reduced signal amplitude dependency for such an alternative arrangement, the biasing voltage potentials $V_{21}$, $V_{22}$ may require tuning as the biasing voltage potentials may need to be larger than the positive supply voltage VDD or smaller than the negative supply voltage VSS.

The transistor biasing voltage potentials $VB_n$, $VB_p$ and/or and the biasing voltage potentials $V_{21}$, $V_{22}$ may be supplied by a biasing network. The biasing network may be connected to, or comprised by, the input buffer 1 or the ADC to which the input buffer 1 is connected.

Figure 4:
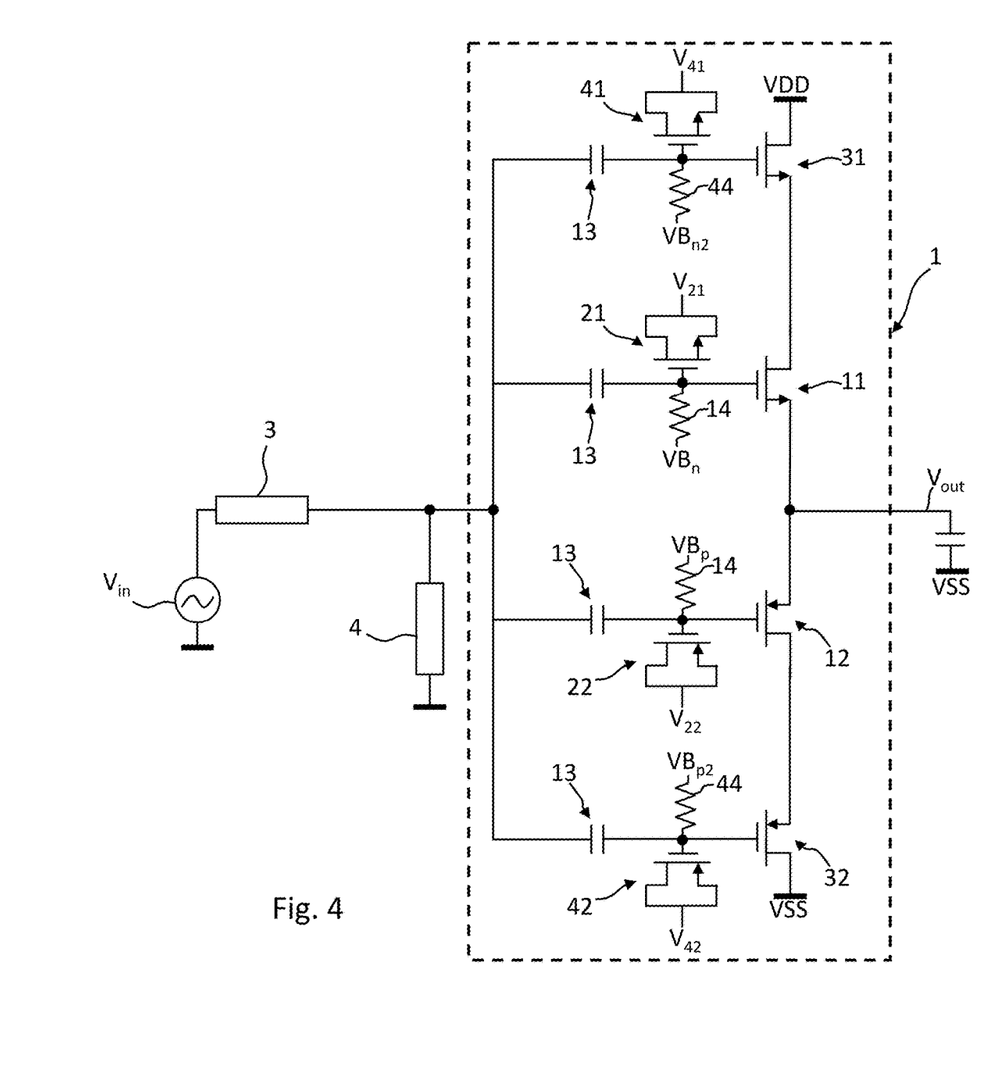
FIG. 4 is a schematic view of an input buffer according to an exemplary embodiment according to an aspect of the present disclosure.

FIG. 4 is a schematic view of an input buffer 1 according to an exemplary embodiment according to an aspect of the present disclosure.

The input buffer 1 shown in FIG. 4 is similar to the input buffers 1 shown in FIGS. 2 and 3, and described in the related descriptions. Therefore, reference is also made to FIGS. 2 and 3 and the related descriptions for an increased understanding of the input buffer 1 shown in FIG. 4 and discussed in the following.

A difference between the input buffer 1 shown in FIG. 4 and the input buffer 1 shown in FIG. 3 is that the input buffer 1 shown in FIG. 4 further comprises a pair of cascoded transistors 31, 32. Therefore, the four transistors 11, 12, 31, 32 of the input buffer 1 may be understood being arranged in a push-pull source follower topology with cascodes (i.e. the cascode transistors 31, 32).

An advantage of an input buffer 1 having a push-pull source follower buffer with cascode transistors 31, 32 is that the cascode transistors 31, 32 may provide a bootstrapping property, as gates of the cascoded transistors 31, 32 receive the same input signal as the gates of the transistors 11, 12 of the push-pull source follower, which provides an improved linearization. More specifically, the cascode transistors 31, 32 provide a constant drain-source voltage potential across the push-pull source follower, which may minimize distortion of the input signal Vin. Cascode transistors 31, 32 further provide protection for the push-pull source follower in that case, by being able to provide biasing for the structure such that each drain-source potential of each transistor 11, 12 remains below the nominal supply level VDD.

In addition, the input buffer 1 may comprise at least two varactors connected to the push-pull source follower topology with cascodes, wherein the varactors are configured to reduce a signal amplitude dependency of a capacitance of the input buffer 1 in a similar manner as described above.

The input buffer may comprise a first varactor connected between the gate of the cascoded nMOS transistor and the first biasing voltage potential and a second varactor connected between the gate of the cascoded pMOS transistor and the second biasing voltage potential.

Alternatively, as shown in FIG. 4, the input buffer 1 may comprise four varactors 21, 22, 41, 42, wherein the first varactor 21 is connected between the gate of the nMOS transistor 11 and the first biasing voltage potential VBn, the second varactor 22 is connected between the gate of the pMOS transistor 12 and the second biasing voltage potential $VB_p$, the third varactor 41 is connected between the gate of the cascoded nMOS transistor 31 and a third biasing voltage potential $VB_{n2}$ and the fourth varactor 42 is connected between the gate of the cascoded pMOS transistor 32 and a fourth biasing voltage potential $VB_{p2}$.

The transistors 31, 32 may be connected to their respective biasing voltage potentials $VB_{n2}$, $VB_{p2}$ via a respective biasing resistor 44.

The third varactor 41 is connected between the gate of the nMOS transistor 31 and a biasing voltage potential $V_{41}$. In a corresponding manner, the fourth varactor 42 is connected between the gate of the pMOS transistor 32 and a biasing voltage potential $V_{42}$.

In the above the inventive concept has mainly been described with reference to a limited number of examples. However, as is readily appreciated by a person skilled in the art, other examples than the ones disclosed above are equally possible within the scope of the present disclosure.

The invention claimed is:

1. An input buffer for an analog-to-digital converter, ADC, configured for receiving an input signal and for outputting an output signal, the input buffer comprising:
   at least one n-channel metal-oxide-semiconductor, nMOS, transistor and at least one p-channel MOS, pMOS, transistor, wherein the at least one nMOS transistor and the at least one pMOS transistor are arranged in a push-pull configuration such that the input signal is fed to gates of the at least one nMOS transistor and the at least one pMOS transistor and the output signal is taken from sources of the at least one nMOS and the at least one pMOS transistors;
   a first varactor connected between a gate of the at least one nMOS transistor and a first biasing voltage potential;
   a second varactor connected between a gate of the at least one pMOS transistor and a second biasing voltage potential,
   wherein the first varactor and the second varactor are configured to reduce a signal amplitude dependency of a capacitance of the input buffer.

2. The input buffer according to claim 1, wherein the at least one nMOS transistor is one nMOS transistor and the at least one pMOS transistor is one pMOS transistor.

3. The input buffer according to claim 2, wherein the first varactor is configured as an nMOS-based varactor and the second varactor is configured as a pMOS-based varactor.

4. The input buffer according to claim 2, wherein at least one of the first biasing voltage potential and the second biasing voltage potential is a tuned biasing voltage potential.

5. The input buffer according to claim 3, wherein gates of the first varactor and second varactors are connected to the gates of the nMOS transistor and the pMOS transistor, respectively, and
   wherein drains and sources of the first varactor and the second varactor are connected to the first biasing voltage potential and the second biasing voltage potential, respectively.

6. The input buffer according to claim 3, wherein drains and sources of the first varactor and the second varactor are connected to the nMOS transistor and the pMOS transistor, respectively, and
   wherein gates of the first varactor and second varactor are connected to the first biasing voltage potential and the second biasing voltage potential, respectively.

7. The input buffer according to claim 2, wherein the gate of the nMOS transistor is connected to a first transistor biasing voltage potential and the pMOS transistor is connected to a second transistor biasing voltage potential; and
   wherein drains of the nMOS and the pMOS transistors are connected to a positive supply voltage and a negative supply voltage, respectively; and
   wherein sources of the nMOS and the pMOS transistors are connected.

8. The input buffer according to claim 2, further comprising a first capacitor connected between the input signal and the nMOS transistor, and a second capacitor connected between the input signal and the pMOS transistor.

9. The input buffer according to claim 2, wherein a first sum of capacitances of the nMOS transistor, the pMOS transistor, the first varactor and the second varactor has a lower signal amplitude dependency than a second sum of capacitances of the nMOS transistor and the pMOS transistor.

10. The input buffer according claim 1, wherein the at least one nMOS transistor and the at least one pMOS transistor comprise a first nMOS transistor and a first pMOS transistor connected with the output signal being taken from sources of the first nMOS transistor and the first pMOS transistor, wherein the at least one nMOS transistor and the at least one pMOS transistor further comprise:
- a cascoded nMOS transistor and a cascoded pMOS transistor, wherein sources of the cascoded nMOS transistor and the cascoded pMOS transistor are connected to drains of the first nMOS transistor and the first pMOS transistor, respectively; and
- wherein the first varactor is connected to a gate of the cascoded nMOS transistor and the second varactor is connected to a gate of the cascoded pMOS transistor.

11. The input buffer according to claim 10, further comprising a third varactor connected between a gate of the first nMOS transistor and a third biasing voltage potential, and a fourth varactor connected between a gate of the first pMOS transistor and a fourth biasing voltage potential, wherein the first, second, third and fourth varactors are configured to reduce a signal amplitude dependency of the capacitance of the input buffer.

12. An ADC converter comprising:
- an input buffer according to claim 1;
- an input terminal connected to the input buffer; and
- at least one sampling capacitor connected to the input buffer.

13. A method for reducing a signal amplitude dependency of an input buffer comprising the steps of:
- feeding an input signal to gates of an nMOS transistor and a pMOS transistor of the input buffer;
- biasing a first varactor which is connected to a gate of the nMOS transistor;
- biasing a second varactor which is connected to a gate of the pMOS transistor; and
- wherein the first varactor and the second varactor are configured to reduce the signal amplitude dependency of a capacitance of the input buffer.

14. The method according to claim 13, wherein the step of biasing the first varactor is performed using a first biasing voltage potential, and the step of biasing the second varactor is performed using a second biasing voltage potential.

15. The method according to claim 14, wherein at least one of the first biasing voltage potential and the second biasing voltage potential is a tuned biasing voltage potential.

* * * * *